(12) United States Patent
Okada et al.

(10) Patent No.: US 6,435,734 B2
(45) Date of Patent: Aug. 20, 2002

(54) OPTOELECTRONIC MODULE

(75) Inventors: Takeshi Okada; Hiromi Nakanishi; Yoshiki Kuhara, all of Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/801,665

(22) Filed: Mar. 9, 2001

(30) Foreign Application Priority Data

Apr. 19, 2000 (JP) .......................................... 2000-117896

(51) Int. Cl.[7] ................................................ G02B 6/36
(52) U.S. Cl. .............................. 385/88; 385/92; 385/94
(58) Field of Search ..................................... 385/88–94

(56) References Cited

U.S. PATENT DOCUMENTS

| | | | |
|---|---|---|---|
| 6,019,523 A | * 2/2000 | Honmou | 385/94 |
| 6,075,911 A | * 6/2000 | Goto | 385/31 |
| 6,170,996 B1 | * 1/2001 | Miura et al. | 385/94 |
| 6,257,772 B1 | * 7/2001 | Nakanishi et al. | 385/89 |
| 6,269,209 B1 | * 7/2001 | Terada et al. | 385/51 |

* cited by examiner

*Primary Examiner*—Brian Healy
*Assistant Examiner*—Kevin S Wood
(74) *Attorney, Agent, or Firm*—Smith, Gambrell & Russell, LLP

(57) ABSTRACT

A triple resin layered optoelectronic module having an inner fluid or gelled resin having a refractive index which is equal to the refractive index of the fiber/waveguide at a temperature between −40° C. and +85° C. for covering the interval between the fiber/waveguide and the LD/PD chip, a medium resin with elasticity for protecting the inner resin, and an outer resin with rigidity for covering and protecting the medium resin, the substrate, the LD/PD chip and the lead frame. A cavity temporally stores the fluid inner resin for preventing the inner resin from flowing away with a help of surface tension.

22 Claims, 7 Drawing Sheets

OPTOELECTRONIC MODULE

BACKGROUND OF THE INVENTION

1. Field of the Invention

This invention relates to optoelectronic modules. The optoelectronic module mean an LD module, a PD module, an LD/PD module, a set of them.

This application claims the priority of Japanese Patent Application No. 2000-117896 filed on Apr. 19, 2000 which is incorporated herein by reference.

2. Description of Related Art

Current optical communication systems utilize three-dimensionally shaped metal-packaged optoelectronic modules having a cylindrical metal package, a PD chip, an LD chip, a lens, a ferrule and a fiber which align along the central axial line perpendicular to the metallic stem. The current module requires a lens for converging light since the light propagates for a long distance which diverges the light beam in the module. The currently used optoelectronic modules excel in the sealing property, the noise-resistance and the reliability. The current LD, PD or LD/PD modules, however, have drawbacks of complicated alignment, large size and high-cost. The bulky prior modules occupy a wide area in a print circuit board.

A further prevalence of the optical communication networks requires smaller sizes and lower cost for LD, PD or LD/PD modules. Recently contrived PLC (Planar Lightguide Circuit) is promising technology for accelerating the size-reduction and cost-curtailment of optoelectronic modules. In the PLC devices, the direction of the light propagation is in parallel with the surface of the substrate. The PLC has a small two-dimensional structure instead of the prior three-dimensional cylindrical structure. The PLC modules have strong points of the omission of alignment and the omission of the lens. Eliminations of the alignment and the lens are advantages of the PLC.

An example of a PLC type PD module is depicted in FIG. 1 (plan view) and FIG. 2 (vertical section. The PLC module is built upon a flat Si bench instead of the tall, cylindrical metallic package. A flat silicon bench 1 has a longitudinal bigger V-groove 2 and a smaller V-groove 3 along the center line. A ferrule 4 is inserted into the bigger V-groove 2 and the fiber 5 is inserted into the smaller V-groove 3. An adhesive fixes the ferrule 4 and the fiber 5 to the grooves. An end of the Si bench is cut to make a lower stage 6 for revealing the front end of the V-groove 3. The lower stage 6 is provided with an optoelectronic device which is a waveguide type PD 7 in the example. The waveguide type PD 7 which has a horizontally spreading sensing layer 8 and a waveguide layer upon the sensing layer allows the light to go into the PD via a front end. The waveguide type simplifies the structure of the PD module.

The example in FIGS. 1 and 2 shows the waveguide type PD upon the substrate because of the simplicity of the structure. The PLC structure allows also a bottom incidence type PD or a top incidence type PD to build a PD module on a flat substrate. The PDs take slightly different relations to the optical fiber axis in the case of the bottom incidence type PD or the top incidence type PD. Someone proposed transmitting modules disposing light sources LED or LD) at extensions of optical fibers upon substrates. A PD module, an LD/PD module and an LD module take similar flat PLC structures. Sometimes the optical fibers are replaced by light waveguides formed upon the substrates (Si-benches) and coupled to outer optical fibers at the end of the substrate.

In any cases, the PLC structure has a substrate, at least an optical fiber or a waveguide on the substrate and at least one optoelectronic device. (PD, LD, LED or APD) disposed at an extension of the fiber or the waveguide upon the substrate. Without a lens, the optical fiber or the waveguide is directly butted to the optoelectronic device chips (PD, LD, LED or APD), which reduces the number of parts and decreases the size of the module.

The prior art of FIGS. 1 and 2 determines the position of the fiber by etching a V-groove upon the substrate and exactly determines the position of the PD by putting the PD at characteristic marks printed on the substrate. Without active alignment, the exact positions of the fibers and the optoelectronic devices are determined by the V-grooves and the characteristic marks designated upon the substrate. The facile positioning in the PLC is called "passive alignment" in contrast with the "active alignment" in the prior art current three dimensional metal packaged modules.

The PLC allows the passive alignment to the optical communication modules, which alleviates the cost of mounting. The PLC further will give low-cost modules by reducing the material cost and the parts cost in addition to the mounting cost. The reduction of the size will facilitate the mounting of the modules on a print circuit board. The PLC is a promising type of optical communication modules. However, the PLC must conquer several difficult problems for being put in practice. The current problems are here described with regard to the PD module shown in FIG. 1 and FIG. 2. Similar problems accompany the LD modules or the LD/PD modules.

The reflection at the end of the fiber is one of the problems of the receiving (PD) module of FIGS. 1 and 2. The end of the fiber is rectangular to the fiber axis. The difference of the refractive indexes between the fiber and the outer space reflects the light at the end of the fiber. The reflected light goes back in the fiber 5 and returns to the laser at the signal-sending port. The returning light induces instability on the oscillation of the laser by perturbing the stimulated oscillation. The quantity of the returning light depends upon the refractive index difference between the fiber and the outer space. The front end of the PD 7 is coated with an antireflection film which annihilates the reflection at the PD front end. What matters is the reflection at the fiber end.

The light reflected at the fiber end is called "reflection light". The rate of the reflection light to the original incidence light is named "Optical Return Loss (ORL)". The ORL is defined by $$\text{ORL} = 10\ \log(P_r/P_{in}),\ (dB) \qquad (1)$$

where $P_{in}$ is the light power travelling in the fiber to the end and $P_r$ is the light power reflected at the end. The light power which goes out of the fiber is $(P_{in} - P_r)$. Since $P_r < P_{in}$, the ORL is always negative. An ideal ORL is minus infinitive. In actual cases, the ORLs take definite minus values.

Even in vertical-cut end fibers, the ORL varies as a function of the refractive index difference between the fiber and the outer medium. In the case of silica ($SiO_2$) fibers ($n_1 = 1.46$), large reflection occurs when the outer medium is air ($n_0 = 1.0$). The vertical reflection ratio $R_{ef}$ at the interface of the media of $n_0$ and $n_1$ is given by $$R_{ef} = \{(n_1 - n_0)/(n_1 + n_0)\}^2 + 0.035 \qquad (2)$$

The air/silica interface brings about ORL=−14.6 dB which is too big for practical use.

The allowable upper limit of ORL depends upon the systems (LD, PD or LD/PD modules). PD modules require an ORL less than −27 dB as a whole. Assuming that the manufacturing margin is −3 dB, the ORL should be less than −30 dB at the interface. Such a small ORL (e.g., ORL≦−30 dB) is required in a wide temperature range between −40° C. and +85° C. for the PD modules. The less than −30 dB ORL in the wide temperature range is a quite rigorous condition.

The prior PD module of FIGS. 1 and 2 cannot suffice the severe requirement. The use of the PD module is narrowly restricted. Some contrivance is requested for enhancing the utility of the FIG. 1 module.

Eq. (2) notifies us that a reduction of the refractive index difference should be effective for reducing the reflection loss at the fiber end. FIG. 3 and FIG. 4 show an improvement of potting a transparent resin having a refractive index $n_2$ similar to the fiber into the gap between the fiber 5 and the PD chip 7. The transparent potting resin 9 alleviates the reflection at the interface between the fiber and the resin. The reflection rate is given by replacing $n_0$ (air) with $n_2$ of the transparent resin 9 in Eq. (2).

The prevalent potting resins are silicone-type resins and acrylate-type resins which are transparent to the 1.3 $\mu$m light and the 1.55 $\mu$m light which are typical wavelengths in the optical communication systems. Some of the silicone-type and the acrylate-type resins have a refractive index similar to the silica optical fiber ($n_1$=1.46). For example, a thermosetting silicone type resin has a refractive index n=1.4 at room temperature which is similar to the silica fiber ($n_1$=1.46). An U (ultraviolet rays)-setting acrylate type resin has a refractive index n=1.5 at room temperature which is also close to the fiber. Only the two resins among the known transparent resins have close refractive indexes to the $SiO_2$ fibers.

When the modules are kept at room temperature, both the transparent UV-setting acrylate resin and the thermosetting silicone resin satisfy the requirement of the ORL less than −30 dB. The refractive indexes of the resins vary as a function of the surrounding temperature. The temperature at which the modules should normally operate has a wide range from −40° C. to +85° C. A change of the temperature would increase the ORL through a variation of the resin refractive index. The wide range (from −40° C. to +85° C.) of the allowable temperature increases the difficulty of finding the resin satisfying the condition of the ORL less than −30 dB. Nobody knows such a convenient resin yet.

FIG. 5 shows the ORL (dB) of the modules having the fiber and the PD chips covered with the current-known potting resins of a UV-setting acrylate resin (◇) and a thermosetting silicone resin (○) as a function of the temperature.

The thermosetting silicone resin (○) takes the minimum ORL of −39 dB at the lowest temperature (−40° C.) in the range (from −40° C. to +85° C.). An increase of the temperature raises the ORL for the thermosetting silicone resin. The ORL raises to −34 dB at 25° C. The highest temperature +85° C. gives the resin a high ORL of −30 dB. The temperature dependence (○) of the ORL is caused by the refractive index of the thermosetting silicone resin which is the nearest (1.40) at −40° C. to the fiber refractive index (1.46) but decreases with a rise of the temperature. The thermosetting silicone resin (○) cannot satisfy the inequality ORL≦−30 dB in the vicinity of 85° C., when the manufacturing margin is taken into account.

The UV-setting acrylate resin (◇) takes the minimum ORL of −37 dB at the highest temperature +85° C. on the contrary. The ORL rises with a decrease of the temperature. The ORL is −34 dB at room temperature (25° C.). The ORL is enhanced to −30 dB at the lowest temperature −40° C. The temperature variation derives from the refractive index which becomes the nearest to the fiber (1.46) at 85° C. but rises with the decrease of the temperature. The UV-setting acrylate resin (◇) cannot satisfy the requirement ORL<−30 dB in the lower limit of −40° C. with the manufacturing margin. Both the UV-setting acrylate resin (◇) and the thermosetting silicone resin (○) are not satisfactory yet as a potting resin for the rigorous criterion of ORL≦−30 dB in the range from 40° C. to +85° C.

The temperature dependent variation of the ORL in resin-coated PD modules derives from the temperature dependent change of the refractive index of the coating resins. Some of the thermosetting silicone resins have refractive indices which vary from 1.48 to 1.37 in the temperature range between −40° C. and 85° C. Some of the UV-setting acrylate type resins have refractive indices which vary from 1.56 to 1.49 in the same temperature range. The temperature dependent variations of refractive indices prohibit nearly all the current-known resins from satisfying the ORL condition of less than −30 dB in the wide temperature range from −40° C. to +85° C. An ideal resin should have a refractive index at a certain temperature nearly equal to the refractive index of the fiber and should have a sufficiently small temperature coefficient ($\delta n/\delta T$; T is the temperature). The resin should have also some physical rigidity when it is hardened(set). Such an ideal resin does not exist at present.

The Inventors have found a candidate resin which can satisfy the requirement of the small ORL in the determined temperature range but is not endowed with rigidity for protecting chips or fibers. The candidate resin the Inventors discovered is one of the UV-setting silicone type resins. The refractive index of the candidate is very close to the refractive index of the silica ($SiO_2$) optical fiber and the temperature variation of the refractive index is also similar to that of the silica fiber. The advantage of the candidate resin is the double similarities to the $SiO_2$ fibers with regard to the refractive index (n) and the temperature dependence ($\delta n/\delta T$) of the refractive index. In addition, the refractive index of the candidate resin crosses the refractive index of the fiber at a certain temperature within the determined temperature range. The crossing is a favorite property of the candidate. The refractive index crossing reduces the ORL to a negative infinitive just at the crossing temperature and maintains the ORL in quite small values in the vicinity of the crossing temperature. Fortunately, the strong fall of the ORL at the crossing temperature reduces the ORL sufficiently in all the temperature range between −40° C. and +85° C. Δ dots show the ORL measured for the candidate resin in FIG. 5 in test modules having a PD, a fiber and a candidate resin layer covering the PD and the fiber.

The candidate ORL falls to −66 dB near 0° C. The sink means that the refractive index crossing occurs in a vicinity of 0° C. between the fiber and the candidate resin. An exact coincidence would bring about a negative infinitive for the ORL. Discrete measuring points are restricted to −40° C., 0° C., +25° C., +75° C. and +85° C. in FIG. 5. The crossing temperature should lie slightly below 0° C. Both a rise or a fall of temperature from the minimum point (crossing point) raises the ORL through an increase of the refractive index differences. The fact that the refractive index has a crossing point ($n_1=n_2$) within the required temperature range (−40° C.~+85° C.) is a favorite property of the candidate. The minimum strongly pulls down the ORL curve far smaller than −30 dB overall. Indeed, the maximum at +85° C. gives a −39 dB ORL which satisfies the condition.

The description may not be understood easily. Silicone type resins have several different species. The silicone type is further divided by the way of hardening. The resins which are hardened by ultraviolet rays are called UV-setting silicone type resins. The resins which are hardened by heat are called thermosetting silicone type resins. Both groups also have some species. The refractive indexes of the resins are varied by changing the ratios of the components.

The refractive index is an important factor of choosing the pertinent resin for covering the devices in the modules. But the refractive index is not a unique criterion of determining the resin. Physical property is another important factor. Some rigidity is required for the coating resin. For example, a kind of the UV-setting silicone resins has a refractive index quite close to the refractive index of the optical fiber. The UV-setting silicone resin is plagued by a physical weak point. The UV-setting silicone resin is gelled instead of being hardened. The UV-set silicone resin has fluidity and is still unstable in shape after the UV-setting. The shape of the gelled silicone resin is changed by external pressure or external forces. If the unstable UV-setting resin is used for covering the PD, the fiber and the inner space in FIG. 3 or FIG. 4, the resin can not maintain the solid shape against the epoxy resin. When the silicone resin with the substrate is covered with the epoxy molding resin, the fluid UV-setting resin will be swept away from the inner space between the PD and the fiber by the pressure of the epoxy resin. Although the UV-setting silicone resin is the most favorable one from the refractive index, the resin cannot be utilized as the transparent resin for covering the PD, the fiber and the interval of them due to the fluidity after setting.

SUMMARY OF THE INVENTION

The optoelectronic module of the present invention has a triple resin structure comprising an inner resin, a medium resin and an outer resin. Among the three resins, the inner resin is the most important. The inner resin should have a refractive index nearly equal to the optical fiber or the optical waveguide. The inner resin is gelled by some means but has some fluidity after setting. The inner resin is, for example, a gelled UV-setting silicone resin or a fluid silicone matching oil having a refractive index nearly equal to the fiber/waveguide. The inner resin which cannot maintain the shape by itself should be stored in a cavity and enclosed further by the medium resin. The cavity and the medium resin determine the shape of the inner resin by enclosing the inner resin. The medium resin should have some rigidity for protecting the fluid inner resin from the outer resin. The outer resin is a hard resin for maintaining the whole shape of the module.

The triplet resin structure is made on a substrate by boring a cavity at the joining region of the optoelectronic device and a fiber/waveguide on the substrate, supplying an inner resin (e.g., a gelled UV-setting silicone resin or a fluid silicone matching oil) having a refractive index nearly equal to the fiber/waveguide into the cavity, potting a medium resin on the inner resin, the PD, the fiber and the substrate for protecting the inner resin. The shape of the inner resin is determined by the cavity and the medium resin. The resin-keeping pond (cavity) can be utilized as an optical path between the fiber/waveguide and the optoelectronic chip by contriving the light path. Furthermore, the V-grooves for sustaining optical fibers upon the substrate can be also utilized as a part of the cavity for keeping the inner resin. In the case, the ready-made grooves can be employed for storing the inner resin.

In the case of the substrate having no V-grooves for the fibers, a cavity (pond) should be made on the substrate for maintaining the fluid inner resin. In this case, the resin pond prohibits the fluid transparent (gelled) resin from flowing away from the interval region of the PD and the fiber/waveguide.

The gelled inner resin cannot maintain the shape due to the fluidity. Then, the inner resin with the optoelectronic chips (PD, LD, LED ) should be enclosed by a harder medium resin. The medium resin should be endowed with medium elasticity not to apply strong stress upon the optoelectronic chips or other optical parts. High resistivity is another property required for the medium resin, because the medium resin comes in contact with electrodes and wiring patterns. Candidates for the medium resin are, e.g., thermosetting silicone resin and UV-setting acrylate resin. The elasticity prevents the medium resin from maintaining the inherent shape for a long time. The substrate is fitted to a member, for example, a lead frame, for accomplishing electrical connection between the optoelectronic devices and external circuits.

Then, the medium resin should be further enclosed by the hard outer resin, for example, an epoxy resin for keeping the determined shape everlastingly. The outer resin should be endowed with high rigidity, waterproofness (sealing) and high resistivity (insulator). A suitable outer resin is an epoxy resin which has been used for the material of the plastic packages of electronic devices. The module is packaged by storing the substrate and the lead frame covered with the medium resin into a case, molding the substrate with the lead frame by the outer resin in the case and capping the case. Otherwise, the module is directly plastic-molded by inserting the substrate with the medium resin into a metallic mold, injecting fluid resin and hardening the resin by heating or cooling in the mold.

The present invention has two features of the transparent fluid, gelled resin stored in a cavity upon the substrate and the triplet resin structure. The gelled, fluid transparent resin reduces the reflection at the end of the fiber/waveguide by the refractive index which is nearly equal to the fiber in the wide temperature range. The transparent resin is unstable by itself but the resin is doubly protected by the medium resin and the outer resin. The double enclosure stabilizes the inner resin. The inner resin allows the modules to maintain the ORL enough below the desired value (e.g., ORL$\leq$−30 dB) in the wide temperature range. The present invention can provide inexpensive small-sized optoelectronic modules (PD modules, LD modules and LD/PD modules) maintaining low ORL in the whole required temperature range.

Why has nobody hit on an idea implying the present invention? All the known resins which maintain a permanent shape after setting cannot satisfy the requirement of ORL$\leq$−30 dB for PD modules in the wide temperature range (−40° C.~+85° C.). Few people have noticed that there are some fluids which can satisfy the rigorous requirement but cannot be hardened completely. Even if anybody had noticed such a fluid, they would have thought that the fluid or the gelled resin could not fill the optical path between the fiber/waveguide and the PD/LD.

The Inventors denied the common sense and tried to make use of the fluidity of the resin or the oil having the suitable refractive index for reducing the ORL. A fluid can be maintained by storing the fluid in a vessel, a cup or a container. A PLC substrate has no room for placing an extra vessel. But a substantial vessel can be given to the substrate by boring a cavity. The cavity would keep the fluid on the substrate. If the fluid-storing cavity is made along the light path between the fiber/waveguide and the PD/LD, the cavity would be effective to reduce the reflection. The flow of the fluid is permanently killed by covering (capping) the fluid with a resin which can be hardened by some means. The capping resin. should be electrically insulating and be stable electrically and thermally. The capping (medium) resin should be elastic even after being set. The elasticity protects the PD, the LD or the AMP from external stress. A thermosetting silicone resin or a UV-setting acrylate resin is suitable for the capping resin. The capping resin cannot be the outermost material due to the elasticity.

The shell should be formed with a harder resin. An epoxy resin is suitable for the outermost resin. The epoxy resin is opaque and rigid after being hardened. The rigidity maintains its own shape permanently. The excess rigidity would damage or degrade inner devices because of strong inner stress caused by the temperature variation. But the present invention encloses the PD, the LD or the ICs by the elastic medium resin which alleviates the stress from the rigid outer resin. The medium resin protects the devices from the external stress or the external force by deforming itself The triple resin layers give such advantages to the optoelectronic modules.

DETAILED DESCRIPTION OF THE PREFERRED EMBODIMENTS

Figure 1:
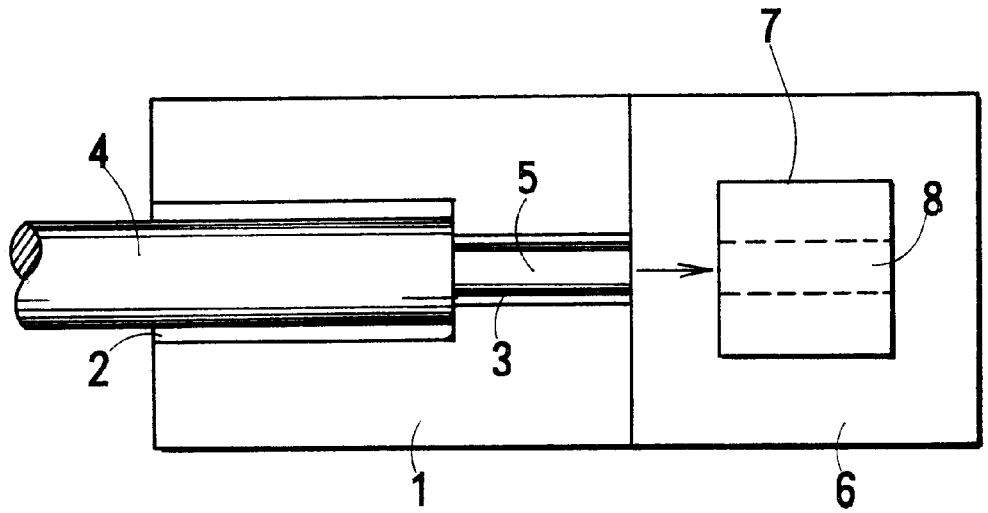
FIG. 1 is a plan view of a prior art PLC type PD module having an air gap between the PD and the fiber end.

The present invention proposes a triple resin layered optoelectronic module including an inner resin having a refractive index nearly equal to that of the fiber/waveguide for covering the interval between the fiber/waveguide and the LD/PD chip on the substrate, a medium resin with elasticity for protecting the inner resin, and an outer resin with rigidity for covering and protecting the medium resin, the substrate, the LD/PD chip and the lead frame. The inner resin is stored in cavities being positively formed or inherently existing on the substrate. The cavity and the surface tension maintain the fluid inner resin at the interval between the PD/LD and the fiber/waveguide.

The present invention can be applied to an LD module, a PD module and an LD/PD module by assigning an LD, a PD or an LD and a PD to the optoelectronic device.

The resin-storing cavity is one of the features of the present invention. An extra new cavity can be positively bored on the substrate as a resin-storing cavity. Some cases allow the modules to make use of the inherent grooves formed for another purpose as the resin-storing cavity. For example, if the light guide medium is an optical fiber, a V-groove is made on the substrate for the passive alignment. The fiber-setting V-groove can be utilized as a resin-storing cavity. If the light guide medium is a light waveguide, an extra cavity or groove should be dug at the end of the light waveguide as a resin-storing cavity. If the PD is a bottom incidence type PD, the substrate sometimes has a path-conversion groove for reflecting the LD light to the PD. The path-conversion groove can be utilized as a resin-storing cavity.

The substrate is made of silicon (Si), ceramic or resin (plastic). A silicon substrate enables the module to form the resin-holding cavity by anisotropic etching. A ceramic substrate allows the module to make the resin-keeping hole together with other structural parts at a stroke by the metallic die. In the case of a plastic substrate, the resin-holding hole can be made with other parts by the molding at a stretch. The properties of the inner resin, the medium resin and the outer resin are as follows.

1. Inner resin

The role is to fill the interval space between the fiber/waveguide and the optoelectronic chip (LD, PD or LED) for lowering the ORL. The refractive index is nearly equal to the fiber/waveguide overall in the required temperature range (−40° C.~+85° C.). The inner resin is transparent to the signal light (1.3 μm or 1.55 μm). The inner resin should be insulating. The inner resin is still fluid or gelled after setting. For example, a UV-setting silicone resin and silicone matching oil are suitable. The UV-silicone resin set by the UV-radiation is still fluid. The silicone matching oil is not set by any means. Since it is oil, the silicone matching oil has fluidity in the module.

2. Medium resin

The role is to cover and protect the inner resin, fiber/waveguide end, the optoelectronic chips. The medium resin should be also insulating. After setting, the medium resin keeps some elasticity. The elasticity enables the medium resin to protect the chips or the fiber/waveguide by alleviating external stress or shock. For example, a thermosetting silicone resin and a UV-setting acrylate resin are available for the medium resin.

3. Outer resin

The role is to determine a rigid external shape of the module by enclosing the substrate, the lead frame, the medium resin and the fiber/waveguide. The outer resin is a main component of the package. The outer resin should be endowed with high rigidity, high sealing performance and high resistivity against invading of water. For example, epoxy resin is suitable.

Embodiment 1 (PD module; FIGS. 6, 7, 8 and 9)

FIG. 6 to FIG. 9 show Embodiment 1 of the present invention applied to a PD module. The shape of a substrate and the structure of mounting have been proposed by Inventors' previous application (U.S. patent application Ser. No. 09/398,148). The novel point of the invention is the three-layered resins. The whole structure of the module is described before describing the triple resin layers.

A flat silicon substrate 11 has a lower front step 12, an upper middle step 13, a lateral groove 14 and a rear step 15. A larger V-groove 16 is cut along a center line on the lower step 12. A smaller V-groove 17 is formed along the center line on the upper middle step 13. A tiny V-groove 18 is also formed on the rear step 15 at the extension of the V-grooves 16 and 17. A silicon single crystal substrate enables anisotropic etching to form the grooves 16, 17 and 18 at a stroke. The height difference between the lower front step 12 and the middle upper step 13 is determined by an inner diameter and an outer diameter of a ferrule 25.

The rear step 15 is covered with metallized patterns 19, 20, 21 and 22 for wiring. The wiring patterns are joined by wires to lead pins of a lead frame. Some patterns are prepared for bonding optoelectronic chips or an amplification IC chip. Preliminarily, an optical fiber 26 is inserted into the ferrule 25. The fiber 26 is inserted and fixed in the smaller V-groove 17 and the ferrule 25 is inserted and fixed in the larger V-groove 16.

A PD chip 27 is die-bonded over the tiny V-groove 18 upon the metallized pattern 19 on the rear step 15. The PD 27 spanning the V-groove 18 is a bottom incidence type PD. A preamplifier IC chip 28 is bonded upon the metallized pattern 21 behind the PD 27. Capacitors 29 and 30 are bonded upon the metallized pattern 21 for reducing the power source impedance and suppressing noise. Wires connect the PD 27, the AMP 28, the capacitors 29 and 30, and the metallized patterns with each other. The metallized patterns are further connected by wirebonding to lead pins of the lead frame.

Figure 7:
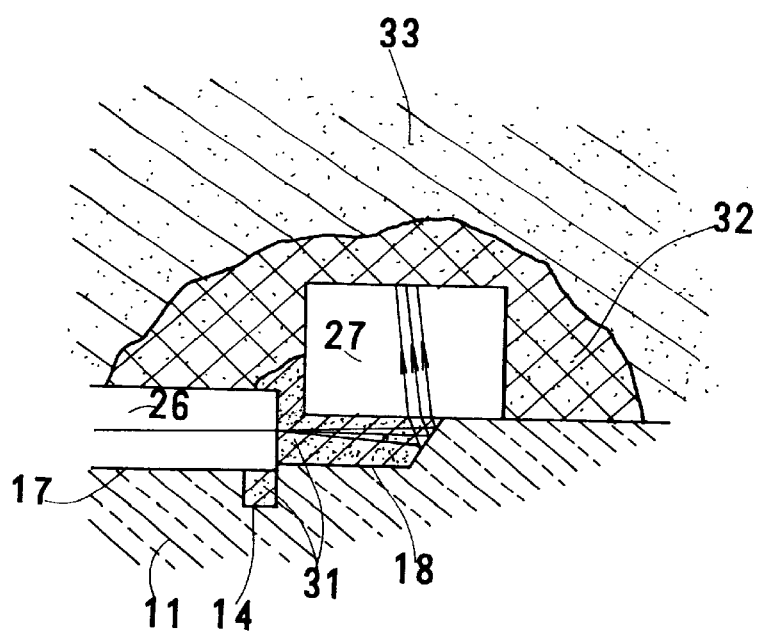
FIG. 7 is a sectional view of a part of the PD module as Embodiment 1 after the resin coating for showing the triple resin layers.

A triple resin layered structure is made on the prepared substrate. An inner resin is filled to an optical path between the fiber 26 and the PD bottom. A middle resin covers the inner resin and the PD 27. An outer resin encloses and protects the medium resin and the substrate 11. FIG. 7 is a sectional view of the module around the light path for showing the triple resin layers. The substrate 11 has inherent cavities of the grooves 14, 17 and 18 available for storing a fluid. An inner resin 31 having a refractive index nearly equal to the refractive index of the fiber is poured to the interval between the PD 27 and the fiber end. The fluid inner resin 31 fills the tiny groove 18, wets the end of the PD 27 and covers the fiber end. A UV-setting silicone resin is used as the fluid inner resin 31. The inner resin 31 is set (gelled) by irradiating the resin by ultraviolet rays in a slanting direction. After the UV-setting, the silicone resin is still fluid, the gelled resin is maintained stably in the resin pond (tiny groove 18 and parts of the grooves 14 and 17). The resin pond (cavity) and the surface tension prohibit the resin 31 from flowing away from the interval space between the PD 27 and the fiber 26.

The inner resin 31 should be transparent to the signal light. The refractive index of the inner resin 31 should be nearly equal to the refractive index of the fiber 26. Preferably, at least a temperature between −40° C. and +85° C. equalizes the refractive index of the inner resin to that of the fiber. The similarity of the refractive indices diminishes the reflection rate at the interface between the fiber and the resin nearly to zero. The ORL decreases below −30 dB. The UV-setting silicone resin enables the PD module to satisfy the requirement of ORL≦−30 dB. This is the conspicuous merit of the inner resin. However, the inner resin has a drawback of the insufficient hardening after setting. If the fluid inner resin spreads and wets all over the surface, the upper resin will be excluded from the surface of the substrate. But the cavities 18, 14 and 17 prevent the fluid resin 31 from pervading the surface.

Figure 8:
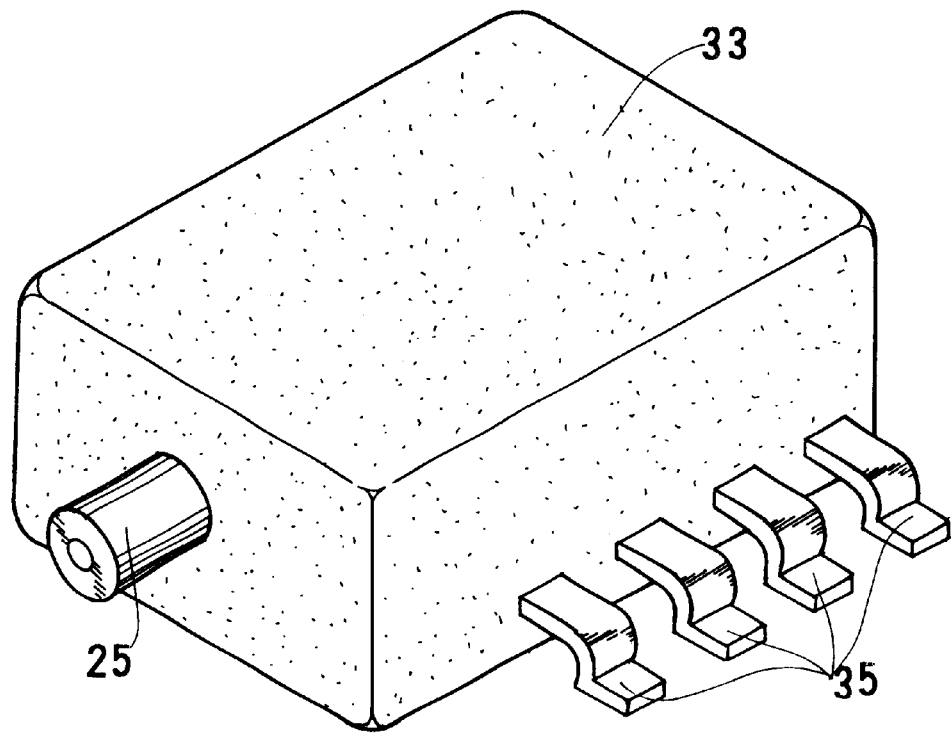
FIG. 8 is a perspective view of the completed PD module as Embodiment 1 after the molding.
Figure 9:
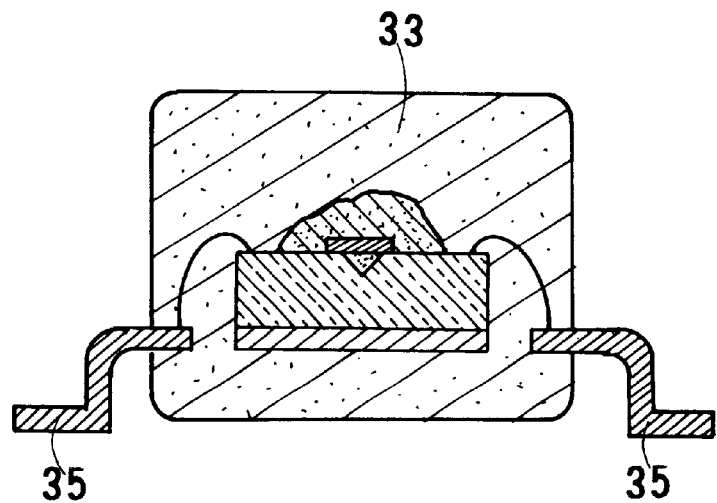
FIG. 9 is a sectional view of the completed PD module as Embodiment 1.

Then, a medium resin 32 is replenished to the joint for covering and protecting the inner resin 31, the PD 27 and the fiber end as shown in FIG. 7. The medium resin 32 need not be transparent. The refractive index of the medium resin is not restricted. Some elasticity after setting is required for the medium resin 32 for protecting the PD, the AMP or the fiber end by alleviating external force or external stress. Favorable medium resin is a thermosetting silicone resin and a UV-setting acrylate resin. These resins are by chance transparent and have refractive indices similar to fiber. But such properties are not necessary for the medium resin. A lead frame having a bottom plate and many leads 35, shown in FIGS. 8 and 9, is fitted to the bottom of the substate.

The substrate is packaged by inserting the medium-resin coated substrate into a metal mold, injecting an fluid outer resin 33 into the mold and setting the outer resin by heating. A PD module is produced by the plastic mold packaging. The outer resin 33 has enough rigidity after setting. An epoxy resin is a pertinent candidate for the outer resin. The molded package is colored by adding a pigment into the outer resin. Usually, a black pigment is employed for giving black color to the package. The black pigment shields the module against outer noise light.

The module has three layered resins. The triple resin structure is the most important feature of the present invention. The roles and properties of the resins are different. The inner resin has the role of reducing the ORL through the similarity of the refractive index to the fiber. The medium resin has the functions of enclosing the inner resin and protecting the optoelectronic chips (PD, AMP) from external stress or force. The outer resin has the functions of maintaining the determined shape, giving rigidity, keeping the substrate with the leadframe, protecting the PD and the AMP and sealing the module against water or air. A produced PD module is shown in FIG. 8. FIG. 9 shows a section of the PD module of FIG. 8.

The ORL and the sensitivity of the produced PD module were measured. The ORL was always less than −35 dB (ORL≦−35 dB) in the temperature range from −40° C. to +85° C. The PD module satisfies the aforementioned difficult requirement of ORL≦−30 dB with a margin.

The sensitivity was 0.9 A/W for the 1.3 $\mu$m-band light. It is sufficiently high sensitivity. The PD module stood the heat-cycle test in the temperature range from −40° C. to +85° C. The embodiment PD module passed the solder-heating test. Mounting the PD module on a print circuit board in a solder reflow furnace induced no decline of the sensitivity and no occurrence of cracks. The triple resin structure gives an excellent package to the module. Another merit is the low-cost due to the plastic mold package and the PLC structure. A further merit is the small size. Embodiment 1 succeeds in proposing a low-cost, small size, low ORL and high sensitivity PD module.

Figure 10:
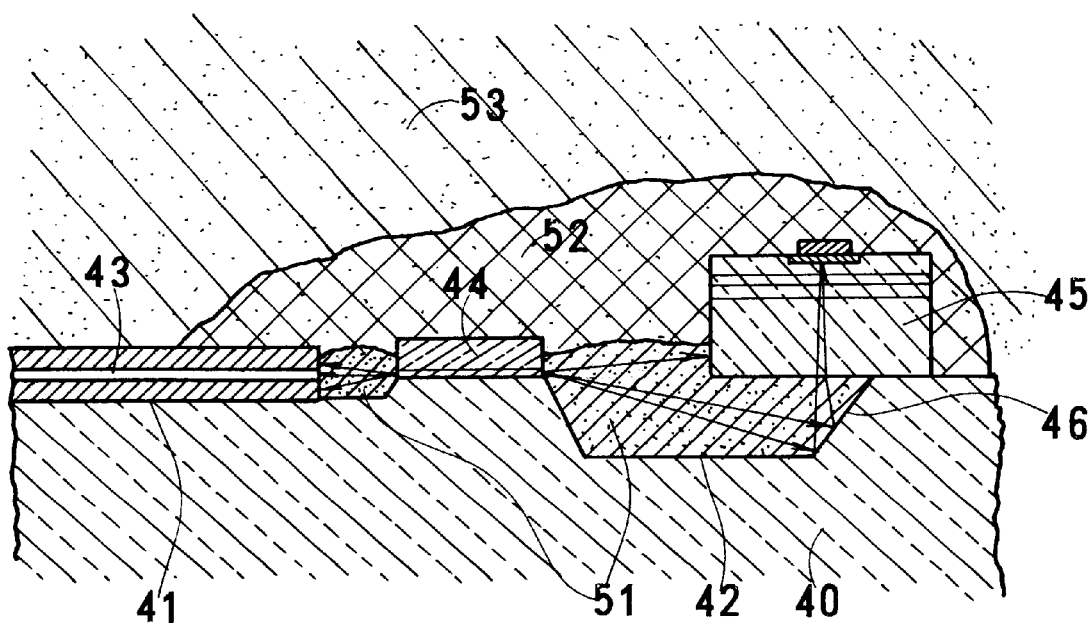
FIG. 10 is a sectional view of a part of an LD module as Embodiment 2 after the resin coating for showing the triple resin layers.
Figure 11:
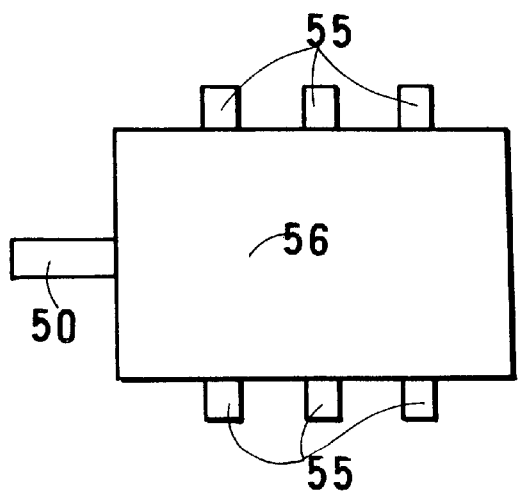
FIG. 11 is a plan view of the LD module as Embodiment 2 after the plastic molding having a plastic package, a ferrule and lead pins.

Embodiment 2 (LD module; FIGS. 10, 11)

Embodiment 2 is another application of the present invention to an LD module built upon a substrate 40. A longitudinal groove 41 for sustaining a fiber 43 is bored along a center line upon the substrate 40. Another path-conversion V-groove 42 is formed along an extension of the V-groove 41 on the substrate 40. The path-conversion groove 42 is coated with a metal film for enhancing the reflection. Metallized patterns are printed upon the substrate 40 for wiring and chip bonding.

The resin-storing cavities (resin ponds) are composed of the path-conversion groove 42 and the fiber-sustaining V-groove 41 in Embodiment 2. An end of the optical fiber 43 is fixed in the V-groove 41. An InGaAsP type LD (laser diode) 44 is upside down (epi-down) bonded upon a middle base of the substrate 40. The LD 44 emits signal light in the forward direction to the fiber 43 and monitoring light in the backward direction to the path-conversion groove 42. A bottom-incidence type PD 45 is normally (epi-up) bonded on the rear region of the substrate over the later half of the path-conversion groove 42. The PD 45 accompanies the LD 44 for monitoring the power of the LD 44 and maintaining the power of the LD 44 at a constant level. The electrode pads of the LD 44 and the PD 45 and the metallized patterns are connected with each other by wirebonding.

A determined quantity of an inner resin 51 (e.g., UV-setting silicone resin) is supplied to an interval between the fiber 43 and the LD 44 and another interval between the LD 44 and the PD 45. The fluid inner resin 51 does not overflow but stays in the grooves 41 and 42. The inner resin 51 satisfies the requirements of the transparency to the signal light and the similarity of the refractive index to the fiber. The inner resin is set by irradiating UV-light. The gelled inner resin 51 is still fluid.

A medium resin 52 is potted upon the inner resin 51. The medium resin 52 (e.g., thermosetting silicone resin or UV-setting acrylate resin) covers and protects the PD 45, the LD 44, the grooves 42 and 41, the inner resin 51 and a portion of the substrate 40. The substrate 40 is joined to a leadframe (not shown in the figures). Wirebonding connects the metallized patterns and the lead pins.

The substrate with the leadframe is stored in a plastic package 56. An outer resin 53 (e.g., epoxy resin) is supplied into the plastic package 56 and is hardened by heating. An LD module with a plastic package is produced. The module has the plastic package 56 as an. external shell for enclosing the epoxy resin 53. FIG. 11 shows a completed LD module having a ferrule 50 and lead pins 55. The epoxy resin 53 has the role of fixing the substrate 40, the leadframe, the ferrule 50 to the package 56.

When a driving current is supplied to the LD 44, the LD 44 emits pulse signal light. The signal light goes forward from the LD 44 and enters the fiber 43. The monitoring light emitted backward from the LD 44 is reflected by the path-conversion groove 42 and is guided into the PD 45. The monitoring light generates a photocurrent in the PD 45. The monitoring current is feedbacked to the LD-driving IC for maintaining the LD power.

The LD module was tested. It was confirmed that the power of the monitoring light is sufficient to control the LD driving current exactly. The examination revealed good initial performance, good after-heat-cycle performance and good after-solder-reflow performance. In the case of the LD module, there is an anxiety of the occurrence of the instability induced by the returning light reflected at the end of the fiber to the LD. Embodiment 2, however, was free from such a problem as the instability up to 2.5 GHz driving of 1 mW LD output power.

Figure 12:
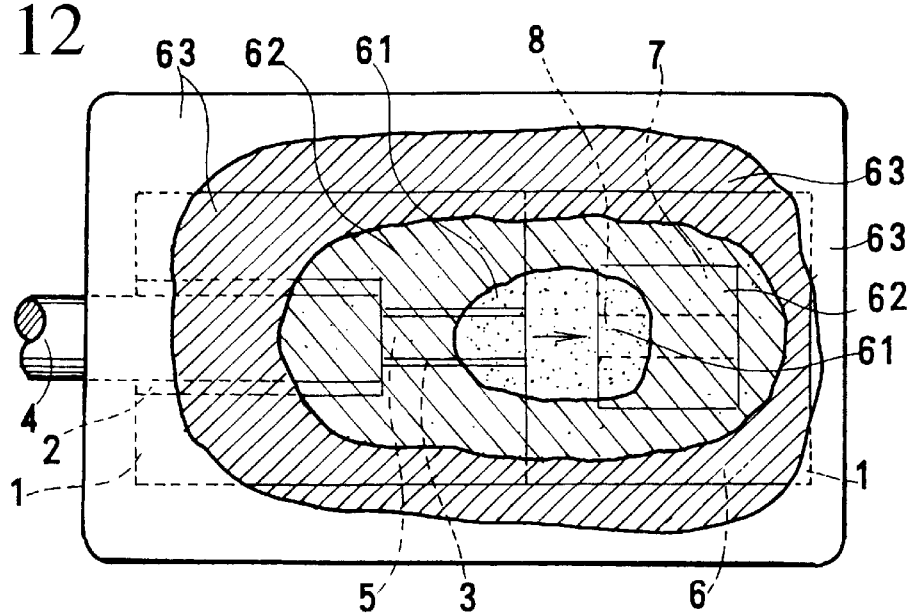
FIG. 12 is a partially sectioned plan view of a PD module as Embodiment 3 for showing the triple resin layers.
Figure 13:
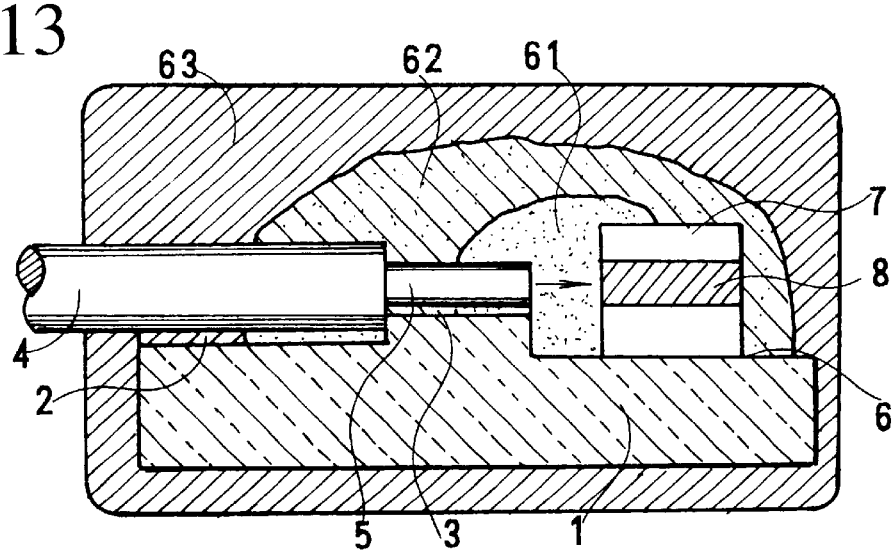
FIG. 13 is a vertically sectioned side view of the PD module as Embodiment 3 after the resin coating for showing the triple resin layers covering the PD, the fiber end and the interval.
Figure 14:
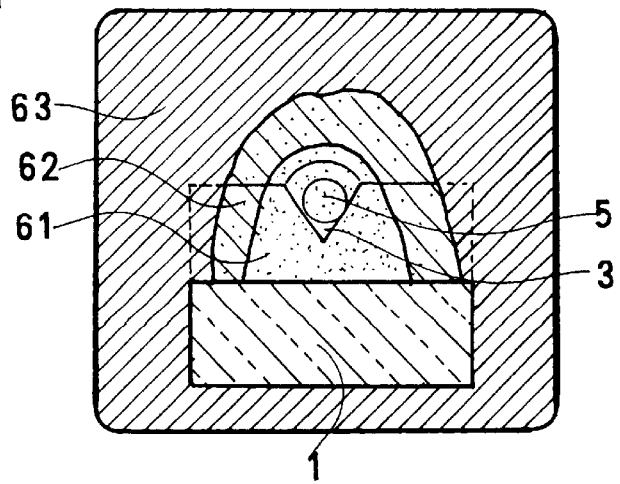
FIG. 14 is a vertically sectioned front view of the PD module as Embodiment 3 after the resin coating for showing the triple resin layers covering the PD, the fiber end and the interval.

Embodiment 3 (PD module; FIGS. 12, 13 and 14)

Figure 2:
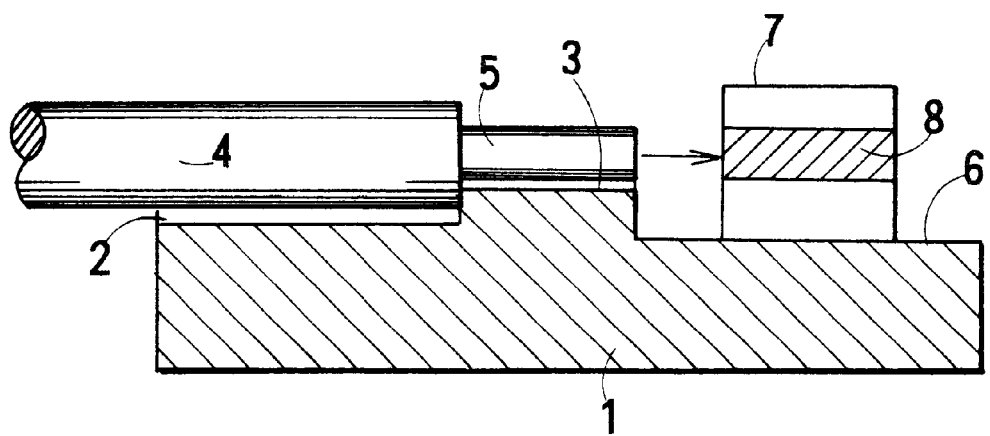
FIG. 2 is a sectional side view of the prior art PLC type PD module having an air gap between the PD and the fiber end.
Figure 3:
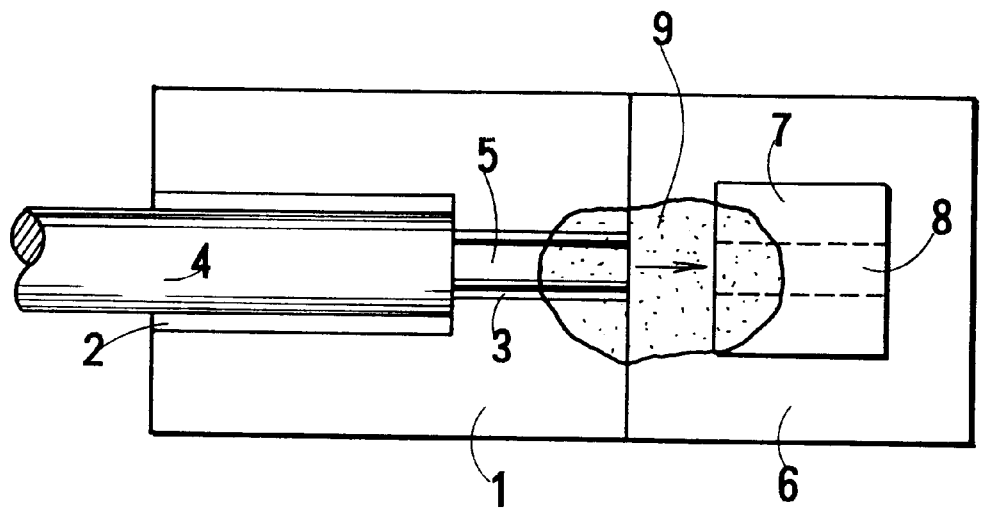
FIG. 3 is a plan view of a prior art PLC type PD module having a resin-filled gap between the PD and the fiber end.
Figure 4:
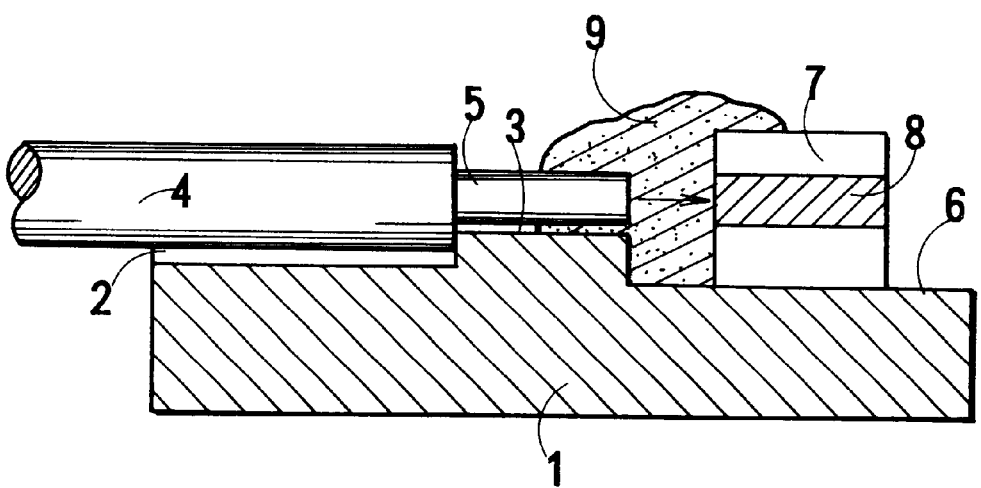
FIG. 4 is a sectional side view of the prior art PLC type PD module having a resin-filled gap between the PD and the fiber end.
Figure 5:
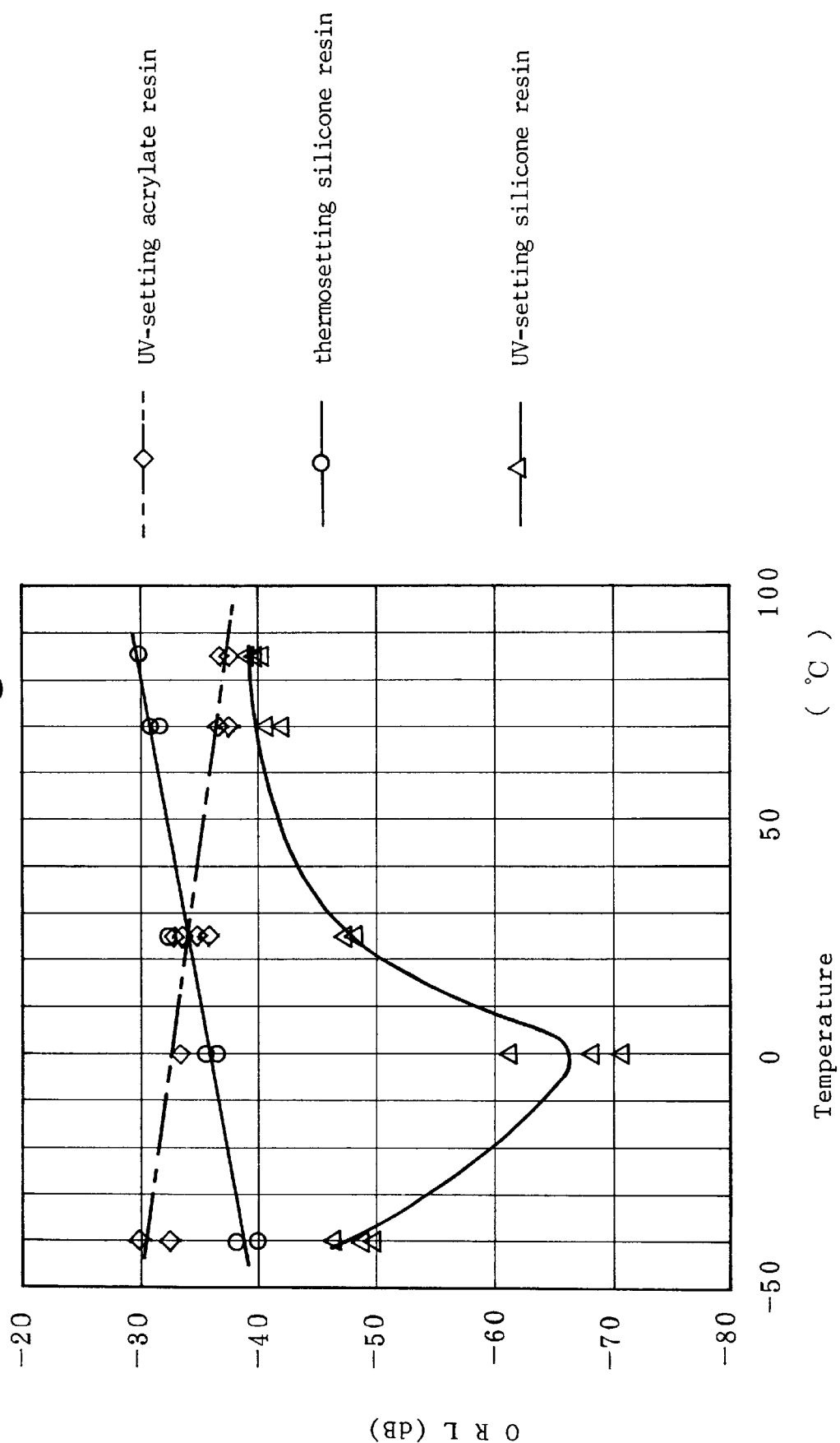
FIG. 5 is a graph showing the temperature dependence of the ORLs of three type PD modules having three transparent resins (UV-setting acrylate resin, thermosetting silicone resin and UV-setting silicone resin) filling the gap between the fiber end and the PD. The abscissa is the temperature (° C.). The ordinate is the ORL (Optical Reflection Loss) (dB).
Figure 6:
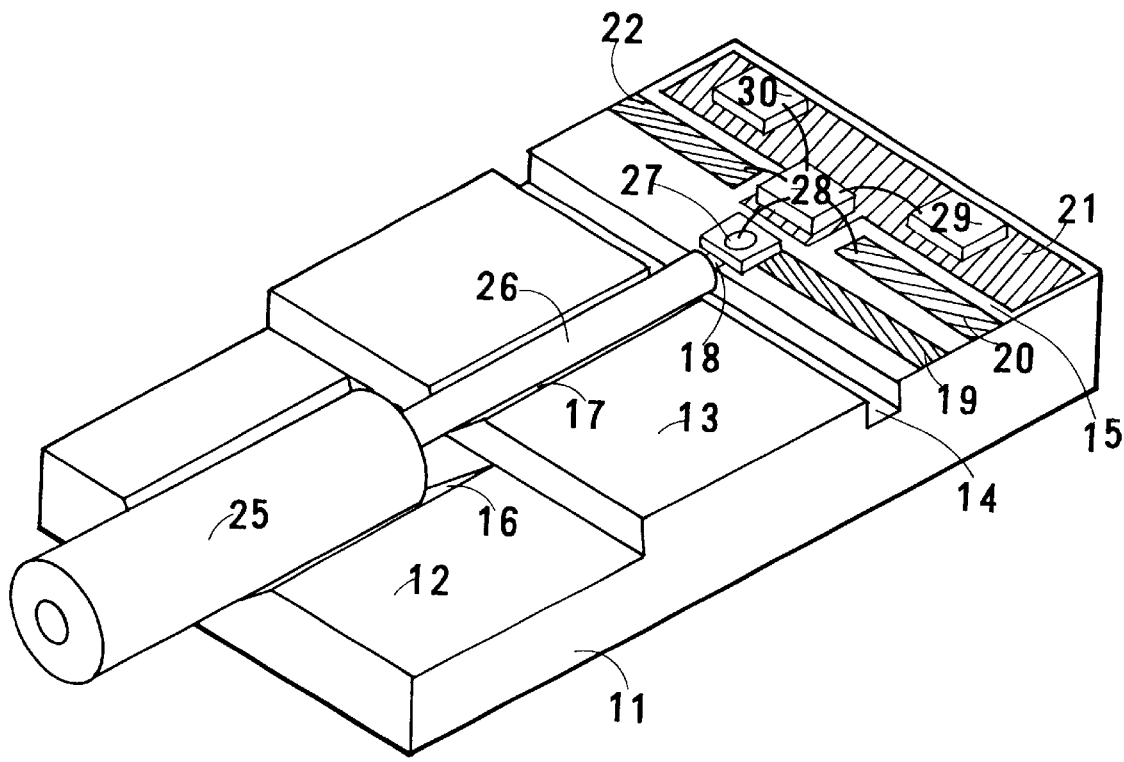
FIG. 6 is an oblique view of a PD module as Embodiment 1 of the present invention before resin coating.

The resin-storing cavity (pond) is not restricted to the holes which are positively formed on the substrate. A cavity which is by chance made by the arrangement of devices is also available for the resin-storing pond. The three layered resin structure can be built by making use of such a substantially formed cavity. Embodiment 3 is another application to the simple module shown in FIG. 1 and FIG. 2. FIG. 12 and FIG. 13 denote the triple resin PD module as Embodiment 3. FIG. 12 is a partially sectioned plan view. FIG. 13 is a vertically sectioned view. The leadframe is omitted in the figures. Common members are denoted by common numerals to FIG. 1 or FIG. 2.

The PD module is built on a flat Si-bench 1 (substrate). The elongate Si bench 1 has a longitudinal larger V-groove 2 and a smaller V-groove 3 along the center line. A ferrule 4 is fixed in the larger V-groove 4. A fiber 5 is fixed into the smaller V-groove 5. The substrate 1 has a rear lower step 6. A waveguide type PD 7 is bonded on the lower step 6. The PD 7 is a monitoring PD having a horizontally pervading light receiving layer 8. A light waveguide layer is formed on the light receiving layer 8. The monitoring light goes into the PD 7 via the front end. The substrate 1 is joined to a leadframe (not shown). A narrow cavity is substantially made between the upper step and the PD 7. Embodiment 3 makes the best use of the step/PD induced cavity.

An inner resin 61 is supplied to the step/PD induced cavity. The inner resin 61 has a refractive index similar to the fiber. Surface tension prohibits the fluid inner resin 61 from flowing out of the cavity. The inner resin 61 fills the interval including the light path from the fiber to the PD 7. The inner resin 61 is set by irradiating UV-rays. After the UV-setting, the inner resin 61 has some fluidity. A medium resin 62 is supplied upon the inner resin 61, the PD 7, the fiber end and a portion of the substrate. The medium resin 62 protects the inner resin 61 and the PD 7. The medium resin is, for example, a thermosetting silicone resin or a UV-setting acrylate resin. An outer resin 63 further encloses the substrate, the leadframe, the medium resin 62 and the ferrule 4. The outer resin 63 is a hard resin which determines the permanent shape of the PD module. Embodiment 3 takes advantage of the substantially formed cavity between the higher step and the PD as a resin pond. A similar version can be applied to an LD module by replacing the PD 7 by an LD chip.

What is claimed is:

1. An optoelectronic module comprising:
    a substrate;
    a first optical part provided upon the substrate which is either an optical fiber or a light waveguide;
    a second optical part being fitted upon the substrate and facing the first optical part;
    a cavity bored at an interval region between the first optical part and the second optical part on the substrate;
    an electrical connecting member fitted to the substrate for connecting the second optical part to external circuits;
    a transparent, gelled or fluid inner resin which has a refractive index equal to the refractive index of the first optical part at a temperature between −40° C. and +85° C. and fills the cavity and the interval region between the first and the second optical parts;
    a medium resin which has elasticity after setting and covers the inner resin and a portion of the first optical part and the second optical part; and an outer resin which covers the medium resin, the first and second optical parts, the substrate and the electrical connecting member and gives a determined outer shape.

2. The optoelectronic module according to claim 1, wherein the second optical part is a light emitting device (LD or LED).

3. The optoelectronic module according to claim 1, wherein the second optical part is a photodetecting device (PD, APD, PD+AMP or APD+AMP).

4. The optoelectronic module according to claim 1, wherein the second optical part is a combination of a light emitting device and a photodetecting device.

5. The optoelectronic module according to claim 1, wherein the inner resin is a UV-setting silicone resin or a silicone matching oil.

6. The optoelectronic module according to claim 1, wherein the medium resin is a thermosetting silicone resin or a UV-setting acrylate resin.

7. The optoelectronic module according to claim 1, wherein the outer resin is an epoxy resin.

8. An optoelectronic module comprising:

a substrate which is a silicon crystal, a ceramic or a resin;

a first optical part which is either an optical fiber or a light waveguide with an axial line and an end and is provided on the substrate;

at least one cavity being formed along the axial line on the substrate and following the end of the first optical part;

a second optical part which is a light emitting device, a photodetecting device or a combination of a light emitting device and a photodetecting device is fitted at an extension of the axial line of the first optical part beyond the cavity on the substrate;

an electrical connecting member fitted to the substrate for connecting the second optical part to external circuits;

a transparent, gelled or fluid inner resin which is either a gelled UV-setting silicone resin or a fluid silicone matching oil having a refractive index similar to the refractive index of the first optical part and fills the cavity and an interval between the first and the second optical parts;

a medium resin which is either a thermosetting silicone resin or a UV-setting acrylate resin having elasticity after setting and covers the inner resin and a portion of the first optical part and the second optical part;

an outer resin which is one of the epoxy type resins, covers the medium resin, the first and second optical parts, the substrate and the electrical connecting member and gives a determined outer shape.

9. The optoelectronic module according to claim 8, wherein the second optical part is a light emitting device (LD or LED).

10. The optoelectronic module according to claim 9, wherein the second optical part is a photodetecting device (PD, APD, PD+AMP or APD+AMP).

11. The optoelectronic module according to claim 9, wherein the second optical part is a combination of a light emitting device and a photodetecting device.

12. The optoelectronic module according to claim 10, wherein the light emitting device is a GaAs type LD or an InGaAsP type LD.

13. The optoelectronic module according to claim 12, wherein the light emitting device is a GaAs type LD or an InGaAsP type LD.

14. The optoelectronic module according to claim 11, wherein the photodetecting device is an InP type PD, an InGaAsP type PD or an InGaAs type PD.

15. The optoelectronic module as claimed in claim 12, wherein the photodetecting device is an InP type PD, an InGaAsP type PD or an InGaAs type PD.

16. An optoelectronic module comprising:

a substrate;

a first optical part provided upon the substrate which is either an optical fiber or a light waveguide;

a second optical part being fitted upon the substrate and facing the first optical part;

an electrical connecting member fitted to the substrate for connecting the second optical part to external circuits;

a transparent, gelled or fluid inner resin which has a refractive index equal to the refractive index of the first optical part at a temperature between −40° C. and +85° C. and fills the an interval region between the first and the second optical parts;

a medium resin which has elasticity after setting and covers the inner resin and a portion of the first optical part and the second optical part; and an outer resin which covers the medium resin, the first and second optical parts, the substrate and the electrical connecting member and gives a determined outer shape.

17. The optoelectronic module according to claim 16, wherein the second optical part is a light emitting device (LD or LED).

18. The optoelectronic module according to claim 16, wherein the second optical part is a photodetecting device (PD, APD, PD+AMP or APD+AMP).

19. The optoelectronic module according to claim 16, wherein the second optical part is a combination of a light emitting device and a photodetecting device.

20. The optoelectronic module according to claim 16, wherein the inner resin is a UV-setting silicone resin or a silicone matching oil.

21. The optoelectronic module according to claim 16, wherein the medium resin is a thermosetting silicone resin or a UV-setting acrylate resin.

22. The optoelectronic module according to claim 16, wherein the outer resin is an epoxy resin.

* * * * *